United States Patent
Lee et al.

(10) Patent No.: US 8,399,363 B1
(45) Date of Patent: Mar. 19, 2013

(54) METHODS OF FORMING OXIDE-FILLED TRENCHES IN SUBSTRATES USING MULTIPLE-TEMPERATURE OXIDE DEPOSITION TECHNIQUES

(75) Inventors: Jung-chan Lee, Suwon-si (KR); Seung-jae Lee, Hwaseong-si (KR); Jin-gi Hong, Yongin-si (KR); Young-min Ko, Seoul (KR)

(73) Assignee: Samsung Electronics Co., Ltd. (KR)

( * ) Notice: Subject to any disclaimer, the term of this patent is extended or adjusted under 35 U.S.C. 154(b) by 108 days.

(21) Appl. No.: 13/036,818

(22) Filed: Feb. 28, 2011

(51) Int. Cl.
*H01L 21/31* (2006.01)
*H01L 21/469* (2006.01)
*H01L 21/76* (2006.01)

(52) U.S. Cl. ......... 438/761; 438/763; 438/787; 438/427

(58) Field of Classification Search .................. None
See application file for complete search history.

(56) References Cited

U.S. PATENT DOCUMENTS

| | | | |
|---|---|---|---|
| 2001/0036705 A1* | 11/2001 | Nishida et al. | 438/296 |
| 2004/0032006 A1* | 2/2004 | Yun et al. | 257/510 |
| 2006/0223279 A1* | 10/2006 | Patraw et al. | 438/427 |

FOREIGN PATENT DOCUMENTS

| | | |
|---|---|---|
| KR | 1020000065984 A | 11/2000 |
| KR | 1020060077486 A | 7/2006 |
| KR | 1020060122414 A | 11/2006 |

* cited by examiner

*Primary Examiner* — Scott B Geyer

(74) *Attorney, Agent, or Firm* — Myers Bigel Sibley & Sajovec, P.A.

(57) ABSTRACT

Methods of forming integrated circuit substrates include forming first and second trenches having unequal widths in a semiconductor substrate and then depositing a first oxide layer at a first temperature into the first and second trenches. The first oxide layer has a thickness sufficient to completely fill the first trench but only partially fill the second trench, which is wider than the first trench. A step is also performed to selectively remove a portion of the first oxide layer from a bottom of the second trench. A second oxide layer is then deposited at a second temperature onto the bottom of the second trench. The second temperature is greater than the first temperature. For example, the first temperature may be in a range from about 300° C. to about 460° C. and the second temperature may be in a range from about 500° C. to about 600° C.

20 Claims, 14 Drawing Sheets

US 8,399,363 B1

METHODS OF FORMING OXIDE-FILLED TRENCHES IN SUBSTRATES USING MULTIPLE-TEMPERATURE OXIDE DEPOSITION TECHNIQUES

FIELD

The invention relates to methods of fabricating semiconductor devices and, more particularly, to methods of fabricating semiconductor devices in which device isolation layers are formed in trenches.

BACKGROUND

As the electronic industry has developed noticeably, semiconductor devices now have high speeds and vast functions. Therefore, in order to satisfy the high speed and vast functions of the semiconductor devices, the integration of the semiconductor devices is further increased.

Accordingly, independent components included in a semiconductor device are closer to each other, and a device isolation layer for electrically isolating the independent unit devices from each other is very important. However, as the integrity of the semiconductor device is increased, the device isolation layer is also finely formed, and thus, electrical characteristics of the semiconductor device may degrade.

SUMMARY

Methods of forming integrated circuit substrates according to some embodiments of the invention include forming first and second trenches having unequal widths, in a semiconductor substrate and then depositing a first oxide layer at a first temperature into the first and second trenches. The first oxide layer has a thickness sufficient to completely fill the first trench but only partially fill the second trench, which is wider than the first trench. A step may also be performed to selectively remove a portion of the first oxide layer from a bottom of the second trench. A second oxide layer can then deposited at a second temperature onto the bottom of the second trench. The second temperature is greater than the first temperature. For example, the first temperature may be in a range from about 300° C. to about 460° C. and the second temperature may be in a range from about 500° C. to about 600° C.

According to some of these embodiments of the invention, the step of depositing a second oxide layer includes completely filling the second trench with the second oxide layer. In addition, the selectively removing may include exposing a portion of the bottom of the second trench and the depositing a second oxide layer may include depositing the second oxide layer directly onto the exposed portion of the bottom of the second trench. In particular, the step of selectively removing may include converting portions of the first oxide layer into electrically insulating spacers on sidewalls of the second trench. In this case, the step of depositing a second oxide layer may include depositing the second oxide layer onto the electrically insulating spacers. These first and second oxide layers can include undoped silica glass.

According to additional embodiments of the invention, the depositing of a first oxide layer may include treating portions of the first oxide layer with ozone. The depositing of the first oxide layer may also be preceded by lining sidewalls of the first and second trenches with a silicon nitride layer. This step of lining the sidewalls of the first and second trenches with a silicon nitride layer may be preceded by a step of depositing a buffer oxide layer directly onto the sidewalls of the first and second trenches. The step of depositing the first oxide layer may be preceded by a step of exposing the sidewalls and bottoms of the first and second trenches to ozone. In addition, the step of depositing a first oxide layer may include depositing a plurality of sub-oxide layers in sequence into the first and second trenches and treating at least a first one of the plurality of sub-oxide layers with ozone.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

The invention now will be described more fully hereinafter with reference to the accompanying drawings, in which illustrative embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Although a few embodiments of the present invention have been shown and described, it would be appreciated by those skilled in the art that changes may be made in these exemplary embodiments without departing from the principles and spirit of the invention, the scope of which is defined in the claims and their equivalents.

It will be understood that when an element or layer is referred to as being "connected" to another element, the element can be directly connected to another element or intervening elements can be present. In contrast, when an element is referred to as being "directly connected" to another element, there are no intervening elements present.

It will be understood that although the terms first and second are used herein to describe various elements, these elements should not be limited by these terms. These terms are only used to distinguish one element from another element. Thus, a first element discussed below could be termed a second element, and similarly, a second element may be termed a first element without departing from the teachings of this disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
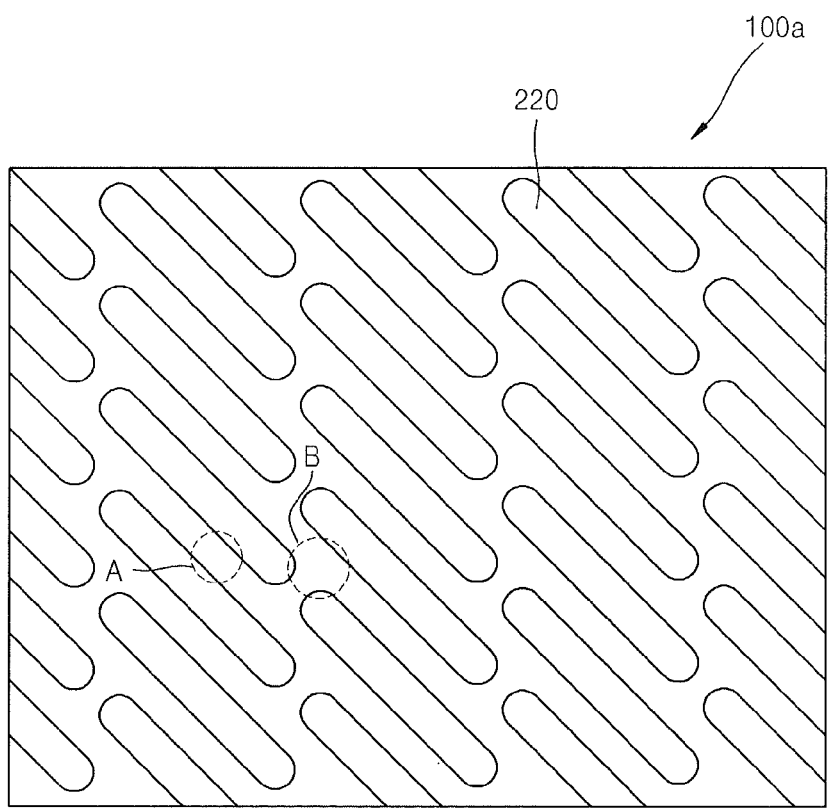
FIG. 1 is a plan view of a cell area at a stage of forming a mask layer pattern for forming a trench according to an embodiment of the present inventive concept.

FIG. 1 is a plan view of a first area when a mask layer pattern is used to form a trench 110 according to an embodiment of the present inventive concept. Referring to FIG. 1, a first area of a preliminary semiconductor substrate 100a is shown. On the first area of the preliminary semiconductor substrate 100a, mask layer patterns 220 are formed for forming a device isolation layer on an active area. The mask layer patterns 220 may be formed such that spaces between the mask layer patterns 220 have constant widths as shown in a first cell area A. However, spaces between the mask layer patterns 220 in a second cell area B in which the mask layer patterns 220 are isolated from each other in a longitudinal axis direction may have widths greater than those in the first cell area A.

Figure 2:
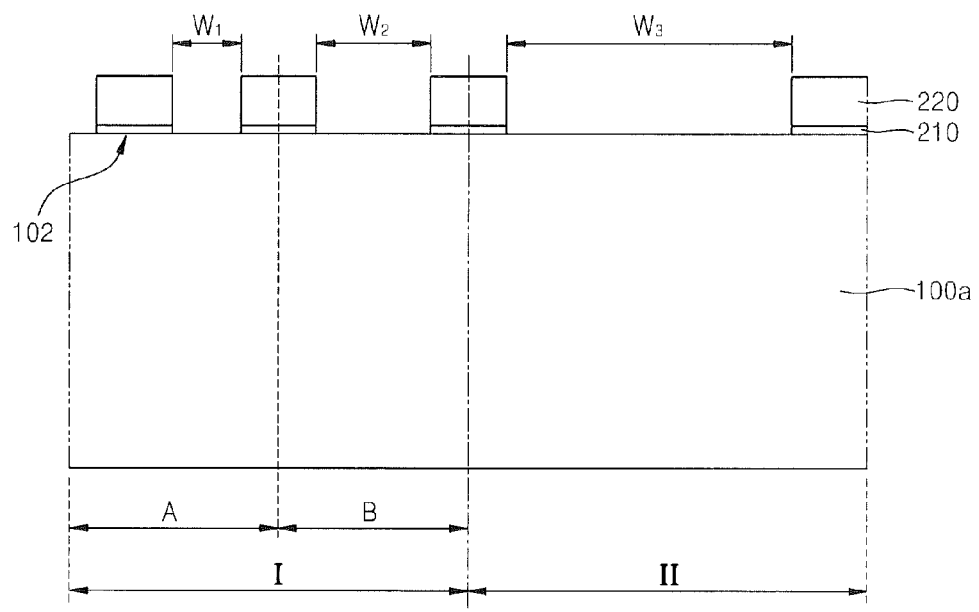
FIG. 2 is a cross-sectional view of the mask layer pattern for forming the trench according to the embodiment of the present inventive concept.
Figure 3:
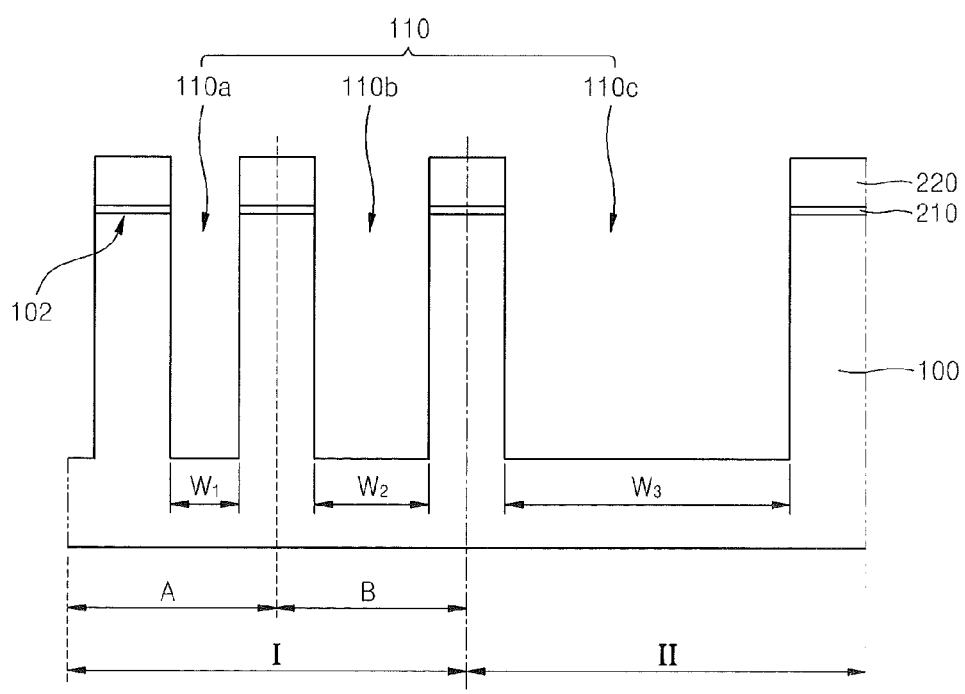
FIG. 3 is a cross-sectional view of the trench according to the embodiment of the present inventive concept.

FIGS. 2-3 are cross-sectional views illustrating a process of using mask layer patterns 220 to form trenches according to an embodiment of the present inventive concept. Referring to FIG. 2, the mask layer patterns 220 are formed on the preliminary semiconductor substrate 100a. The preliminary semiconductor substrate 100 may be a semiconductor substrate having a flat upper surface, for example, a silicon substrate. Alternatively, the preliminary semiconductor substrate 100a may be a silicon on insulator (SOI) substrate, a gallium-arsenide substrate, a silicon germanium substrate, a ceramic substrate, a quartz substrate, or a glass substrate for display. The preliminary semiconductor substrate 100a may include an impurity layer (not shown) for forming at least one well. The preliminary semiconductor substrate 100a may be defined to have a first area I and a second area II. The first area I may be a cell area in which memory cells of a memory device may be formed, and the second area II may be a peripheral circuit area or a core area of the memory device as an example of a semiconductor device.

The mask layer patterns 220 may include each a nitride layer. For example, the mask layer patterns 220 may be formed of a silicon nitride layer. The mask layer patterns 220 may be formed by a general photolithography process and an etching process after forming a mask layer (not shown), or may be formed by a double patterning technology. Portions of the preliminary semiconductor substrate 100a located under the mask layer patterns 220 may be used as active regions. That is, the mask layer patterns 220 may cover the active regions 102. Trenches and device isolation layers filling the trenches may be formed on portions of the preliminary semiconductor substrate 100a, which are exposed by the mask layer patterns 220, in post-processes.

Pad oxide layer patterns 210 may be further formed between the mask layer patterns 220 and the preliminary semiconductor substrate 100a. The pad oxide layer patterns 210 may reduce stress that may be applied to the preliminary semiconductor substrate 100a by the mask layer patterns 220. The pad oxide layer patterns 210 may each be formed of, for example, a silicon oxide layer. The pad oxide layer patterns 210 may be formed through an etching process for forming the mask layer patterns 220 after forming a pad oxide layer (not shown).

The first area I is divided into a first cell area A and a second cell area B. The first cell area A and the second cell area B is divided by widths of the spaces between the mask layer patterns 220. A first width W1 that is the width of the space between the mask layer patterns 220 in the first cell area A is less than a second width W2 that is the width of the space between the mask layer patterns 220 in the second cell area B. Since cross-sections of the first and second cell areas A and B shown in FIG. 2 are shown to represent the widths of the spaces between the mask layer patterns 220, they may not be the cross-sections taken along the same direction. That is, the cross-sections of the first and second cell areas A and B are shown to appropriately represent the widths of the spaces between the mask layer patterns 220 or widths of the trenches.

The second area II is formed so that a third width W3 of the space between the mask layer patterns 220 is greater than the first width W1 and the second width W2. The third width W3 may not be a fixed width. That is, in the second area II, the spaces between the mask layer patterns 220 may have various widths that are greater than the first width W1 and the second width W2.

Referring to FIG. 3, the trench 110 is formed by performing an etching process using the mask layer patterns 220 as an etching mask. Hereinafter, the preliminary semiconductor substrate 100a, shown in FIG. 2, in which the trench 110 is formed, will be referred to as a semiconductor substrate 100. The trench 110 may include a first trench 110a, a second trench 110b, and a third trench 110c. The uppermost surface of the semiconductor substrate 100 divided by the trench 110 is defined as the active area 102, on which unit devices such as a transistor may be formed in post-processes.

The first trench 110a is formed in the first cell area A in the first area I, and may have the first width W1. The second trench 110b is formed in the second cell area B in the first area I, and may have the second width W2. In addition, the third trench 110c is formed in the second area II, and may have the third width W3. Since the width of the trench 110 is the same as that of the space between the mask layer patterns 220, the third width W3 that is the width of the third trench 110c may be greater than the first and second widths W1 and W2 of the first trench 110a and the second trench 110b, and the second width W2 of the second trench 110b may be greater than the first width W1 of the first trench 110a.

The first width W1 of the first trench 110a may be within a range of 10 Å to 300 Å, for example. The second width W2 of the second trench 110b may be within a range of 20 Å to 1000 Å, for example. In addition, the third width W3 of the third trench 110c may have various values within a range greater than those of the first and second widths W1 and W2.

Figure 4A:
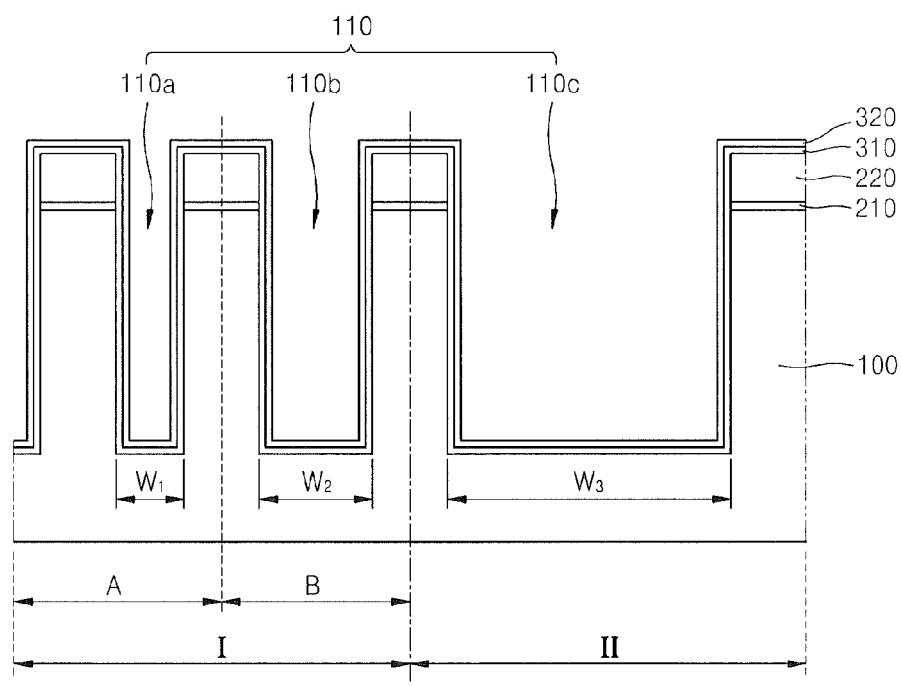
FIG. 4A is a cross-sectional view of a buffer oxide layer and a trench liner layer formed according to the embodiment of the present inventive concept.

FIG. 4A is a cross-sectional view illustrating a process of forming a buffer oxide layer 310 and a trench liner layer 320 according to the embodiment of the present inventive concept. Referring to FIG. 4A, a buffer oxide layer 310 and a trench liner layer 320 may be formed on the semiconductor substrate 100 so as to cover inner surfaces of the trench 110. The buffer oxide layer 310 may be formed of an oxide material, for example, a silicon oxide layer. The trench liner layer 320 may be formed of a nitride material, for example, a silicon nitride layer. The buffer oxide layer 310 and the trench liner layer 320 may be formed thin so as not to fill the entire inner portion of the trench 110. Therefore, the first through third widths W1 through W3 of the first through third trenches 110a through 110c may be reduced due to the buffer oxide layer 310 and the trench liner layer 320, and still the first trench 110a has the narrowest width and the third trench 110c has the widest width.

One of the buffer oxide layer 310 and the trench liner layer 320 may be formed on the semiconductor substrate 100. Alternatively, the buffer oxide layer 310 and the trench liner layer 320 may not be formed and post-processes are performed. Hereinafter, both of the buffer oxide layer 310 and the trench liner layer 320 are formed on the semiconductor substrate 100. However, at least one of the buffer oxide layer 310 and the trench liner layer 320 may not be formed, as described above.

Figure 4B:
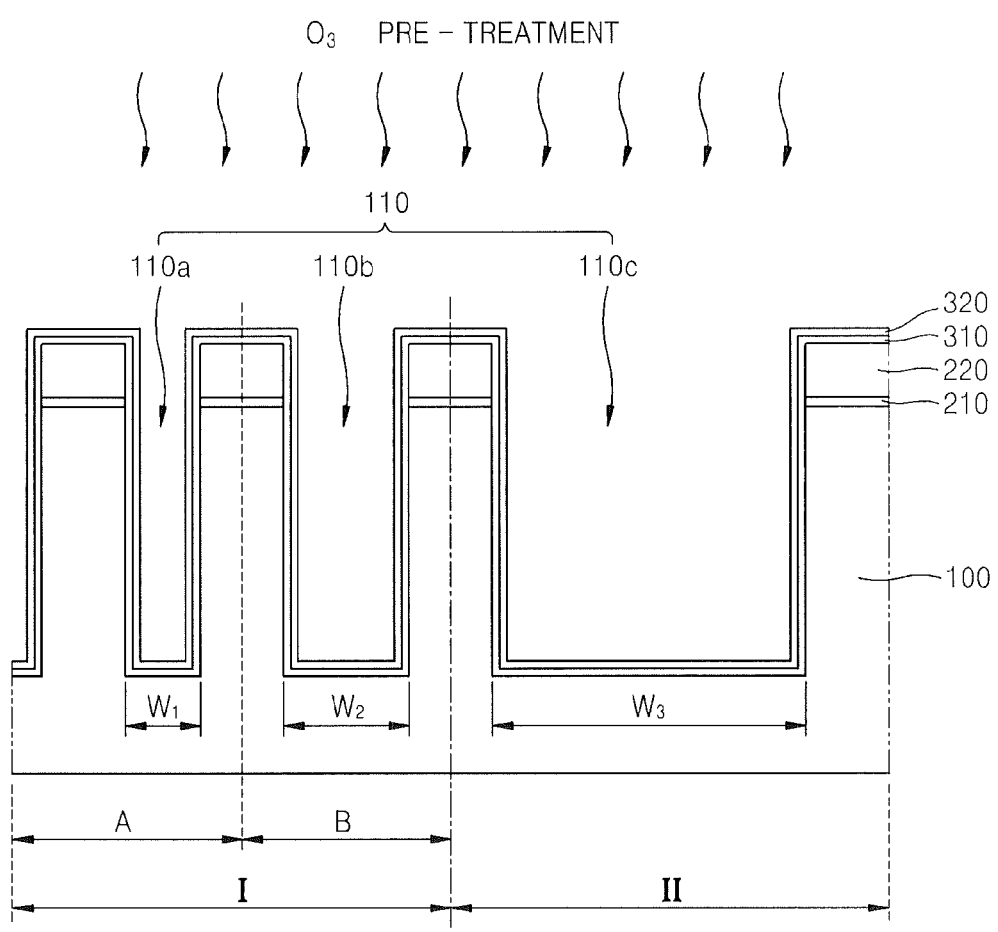
FIG. 4B is a cross-sectional view illustrating a process of performing an ozone pre-treatment according to the embodiment of the present inventive concept.

FIG. 4B is a cross-sectional view illustrating a process of performing an ozone pre-treatment according to the embodiment of the present inventive concept. Referring to FIG. 4B, the semiconductor substrate 100 may be pre-treated by using ozone ($O_3$) gas selectively. In more detail, a surface of the resultant structure from the previous process may be pre-treated by the $O_3$ gas. That is, when the buffer oxide layer 310 or the trench liner layer 320 is formed on the semiconductor substrate 100, a surface of the buffer oxide layer 310 or the trench liner layer 320 may be pre-treated by using the $O_3$ gas. If the buffer oxide layer 310 and the trench liner layer 320 are not formed on the semiconductor substrate 100, the surface of the semiconductor substrate 100 may be pre-treated by using the $O_3$ gas. Even when the buffer oxide layer 310 or the trench liner layer 320 is formed on the semiconductor substrate 100, the resultant structure may also be referred to as the semiconductor substrate 100. Thus, it may be seen that the surface of the semiconductor substrate 100 is pre-treated by using the $O_3$ gas. Here, the treatment using the $O_3$ gas is a process before forming a first oxide layer that will be described later, and thus, is referred to as the pre-treatment.

The pre-treatment on the surface of the semiconductor substrate 100 by using the $O_3$ gas may be selectively performed. When the pre-treatment using the $O_3$ gas is performed, a film quality of the first oxide layer that will be described later may be improved. For example, when the pre-treatment using the $O_3$ gas is performed, voids or pores generating in the first oxide layer may be prevented. If the first oxide layer that will be described later is sufficiently thin, the pre-treatment using the $O_3$ gas may be omitted. The pre-treatment using the $O_3$ gas may be performed by supplying a flow of $O_3$ gas for 5 to 1000 seconds.

Figure 5:
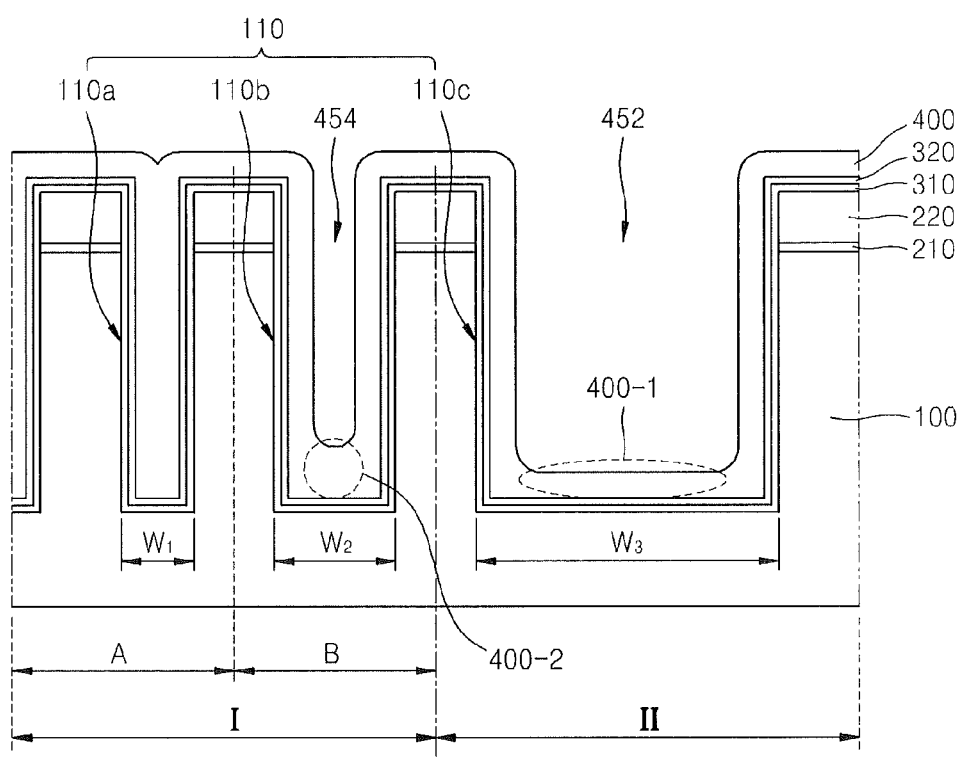
FIG. 5 is a cross-sectional view of a first oxide layer formed according to the embodiment of the present inventive concept.

FIG. 5 is a cross-sectional view illustrating a process of forming a first oxide layer 400 according to the embodiment of the present inventive concept. Referring to FIG. 5, the first oxide layer 400 is formed to cover the entire semiconductor substrate 100. The first oxide layer 400 becomes a part of the device isolation layer after performing post-processes. Therefore, the first oxide layer 400 may be formed of, for example, undoped silica glass (USG), for satisfying electric insulating properties required to the device isolation layer. The first oxide layer 400 may be formed to a predetermined thickness from the surface of the semiconductor substrate 100. Thus, the first trench 110a having the narrowest width may be firstly filled by the first oxide layer 400.

The first oxide layer 400 may be formed to have a thickness that is equal to or greater than ½ of the first width W1 and less than ½ of the second width W2. Therefore, when the first trench 110a is filled completely by the first oxide layer 400, the second trench 110b and the third trench 110c having a greater widths than the first width W1 may include recesses, namely, first and second recesses 454 and 452, which are spaces remaining after forming the first oxide layer 400. Hereinafter, the recess formed in the third trench 110c having the widest width will be referred to as the first recess 452, and the recess formed in the second trench 110b having a smaller width than that of the third trench 110c will be referred to as the second recess 454. Since the third trench 110c has a greater width than that of the second trench 110b, the first recess 452 may have a width greater than a width of the second recess 454. For example, when the first width W1 is 20 Å, the second width W2 is 50 Å, and the buffer oxide layer 310 and the trench liner layer 320 are not formed or have ignorable thicknesses, the first oxide layer 400 may be formed to have a thickness that is equal to or greater than 10 Å and less than 25 Å. If the second width W2 is 1000 Å or greater, the first oxide layer 400 may be formed to have a thickness that is less than 500 Å.

The first oxide layer 400 may be formed at a first processing temperature that is a relatively low temperature. The first oxide layer 400 may be formed by a deposition process at a first processing temperature of 300° C. to 460° C. Here, the first processing temperature for forming the first oxide layer 400 is relatively lower than a processing temperature of post-deposition processes.

However, when the first oxide layer 400 is formed at the first processing temperature that is relatively low, the deposition speed of the first oxide layer 400 may vary depending on a material located under the first oxide layer 400. That is, as described above, although the first oxide layer 400 is formed to have a constant thickness from the surface of the semiconductor substrate 100; however, the first oxide layer 400 may vary in thickness according to the material under the first oxide layer 400 when the first oxide layer 400 is formed at the first processing temperature. Although the buffer oxide layer 310 or the trench liner layer 320 may be formed directly under the first oxide layer 400, the deposition speed of the first oxide layer 400 is largely affected by the semiconductor substrate 100 and the mask layer patterns 220 because the thickness of the buffer oxide layer 310 or the trench liner layer 320 is thin.

When the first oxide layer 400 such as the USG is formed at the first processing temperature that is relatively low, the deposition speed on the silicon is faster than that on the silicon nitride layer. That is, the deposition speed of the first oxide layer 400 on the semiconductor substrate 100 that is under the trench 110 is relatively faster than the deposition speed of the first oxide layer 400 on the surfaces of the mask layer patterns 220 that are located in the trench 110. Therefore, even when the inner space of the trench 110 is narrow, a lower portion of the trench 110 is filled by the first oxide layer 400 before an upper portion of the trench 110 is blocked by the first oxide layer 400. Then, generation of voids that may occur in the trench 110a when the first trench 110a is filled by the first oxide layer 400 can be prevented.

In addition, since the second width W2 of the second trench 110b is less than the third width W3 of the third trench 110c, the first oxide layer 400 formed on a bottom surface of the second trench 110b may be thicker than the first oxide layer 400 formed on a bottom surface of the third trench 110c. That is, a portion of first oxide layer 400-2 formed on a lower portion of the second recess 454 may be thicker than a portion of first oxide layer 400-1 formed on a lower portion of the first recess 452.

In addition, the first oxide layer 400 formed on an upper portion of the second trench 110b, that is, side surfaces of the mask layer patterns 220, may be thinner than the first oxide layer 400 formed on the lower portion of the second trench 110b, that is, the bottom surface and adjacent side surfaces of the second trench 110b. Therefore, the second recess 454 that is the remaining space in the second trench 110b after forming the first oxide layer 400 may have an upper portion, that is, the side portions of the mask layer patterns 220, which is greater than a lower portion thereof.

Figure 6A:
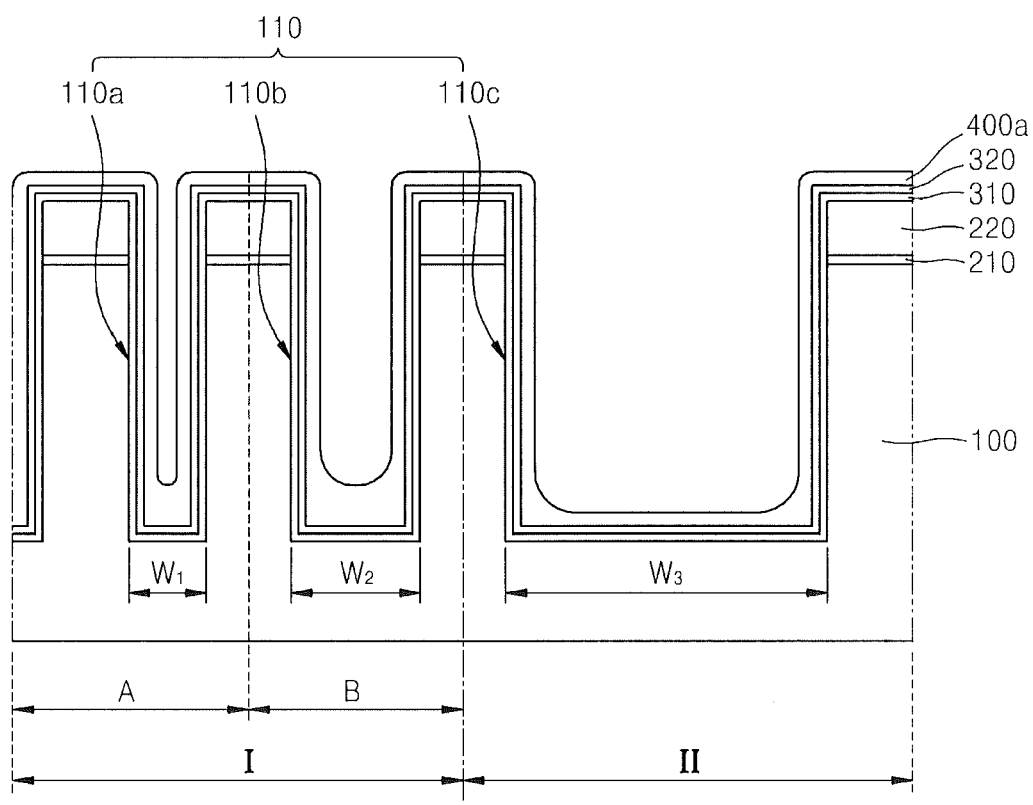
FIG. 6A is a cross-sectional view illustrating forming of a first sub-oxide layer according to another embodiment of the present inventive concept.
Figure 6B:
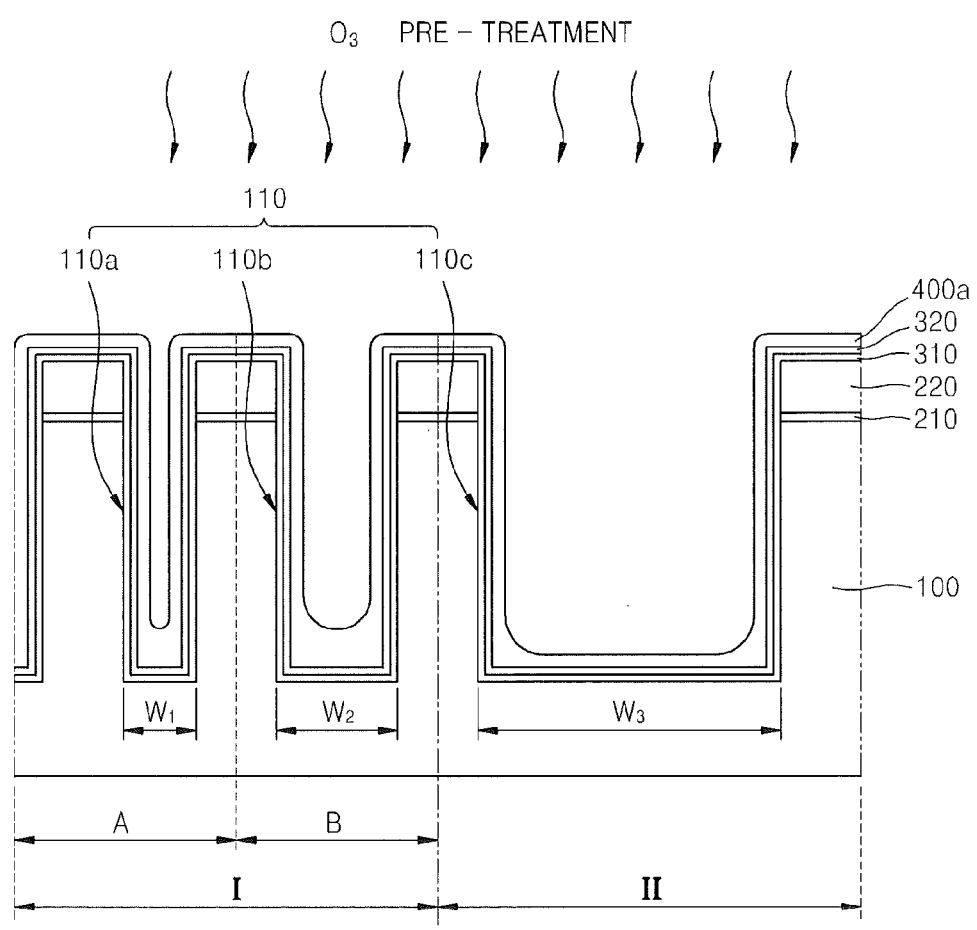
FIG. 6B is a cross-sectional view illustrating performing of an ozone pre-treatment according to the embodiment of the present inventive concept.
Figure 6C:
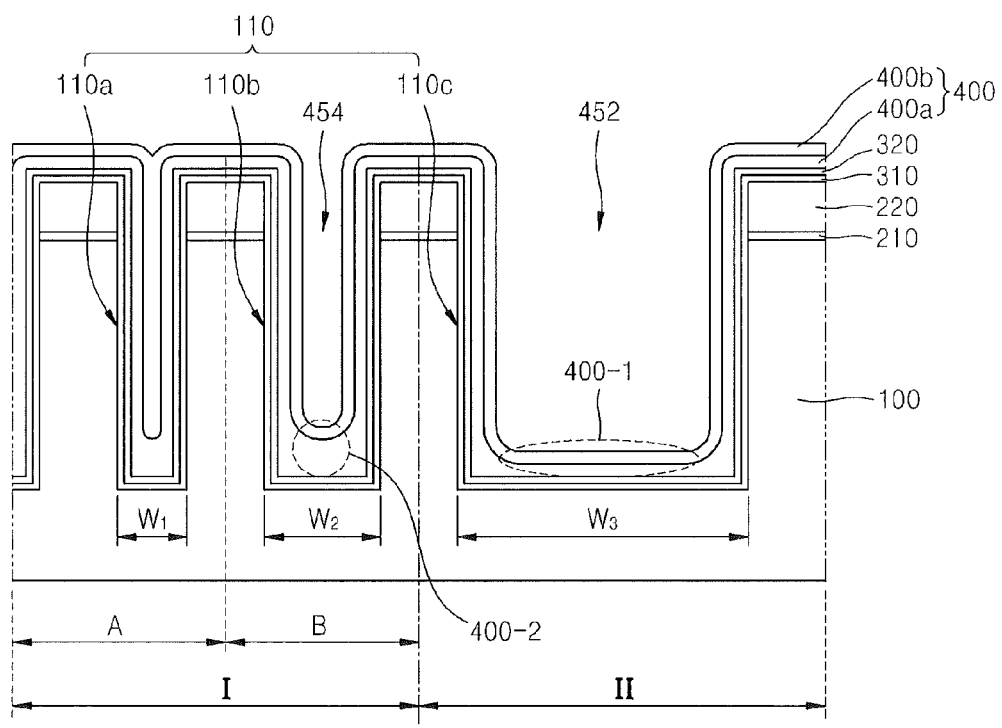
FIG. 6C is a cross-sectional view illustrating forming of a second sub-oxide layer according to the embodiment of the present inventive concept.

FIGS. 6A through 6C are cross-sectional views illustrating processes of forming a first oxide layer 400 according to another embodiment of the present inventive concept. FIG. 6A is a cross-sectional view illustrating a process of forming a first sub-oxide layer 400a according to the embodiment of the present inventive concept. Referring to FIG. 6A, the first sub-oxide layer 400a is formed to cover the entire semiconductor substrate 100. The first sub-oxide layer 400a becomes a part of the first oxide layer 400 that will be described later. When comparing FIGS. 5 and 6A, the first sub-oxide layer 400a may be thinner than the first oxide layer 400. The first sub-oxide layer 400a may not completely fill the inner spaces of the first through third trenches 110a through 110c. The first sub-oxide layer 400a may be formed of the same material for forming the first oxide layer 400 shown in FIG. 5, and may be formed at the same processing temperature as that of the first oxide layer 400.

FIG. 6B is a cross-sectional view illustrating a process of performing an $O_3$ pre-treatment according to another embodiment of the present inventive concept. Referring to FIG. 6B, the surface of the semiconductor substrate 100, on which the first sub-oxide layer 400a is formed, is pre-treated by using the $O_3$ gas. Here, the treatment using the $O_3$ gas is a process before forming a second sub-oxide layer that will be described later, and thus, it is referred to as the pre-treatment. When the pre-treatment using the $O_3$ gas is performed, the quality of the second sub-oxide layer that will be described later may be improved. For example, when the pre-treatment using the $O_3$ gas is performed, generation of voids or pores in the second sub-oxide layer that will be described later may be prevented. The pre-treatment using the $O_3$ gas may be performed by supplying a flow of $O_3$ gas for 5 to 1000 seconds.

FIG. 6C is a cross-sectional view illustrating a process of forming a second sub-oxide layer 400b according to another embodiment of the present inventive concept. Referring to FIG. 6C, the second sub-oxide layer 400b is formed on the first sub-oxide layer 400a that is pre-treated by using the $O_3$ gas to completely form the first oxide layer 400. The second sub-oxide layer 400b may be formed of the same material as that of the first oxide layer 400 shown in FIG. 5, and may be formed at the same processing temperature as that of the first oxide layer 400 shown in FIG. 5.

Referring to FIGS. 5 and 6C, the first oxide layer 400 shown in FIG. 5 may be formed by performing the process once; however, the first oxide layer 400 shown in FIG. 6C is formed by performing a two-stage process of forming the first and second sub-oxide layers 400a and 400b. The first oxide layer 400 may include the first sub-oxide layer 400a and the second sub-oxide layer 400b as shown in FIG. 6C; however, the first oxide layer 400 may include three or more sub-oxide layers.

Referring to FIGS. 4B, 6A, 6B, and 6C, the $O_3$ pre-treatment may be performed before forming each of the first and second sub-oxide layers 400a and 400b. Therefore, if the first oxide layer 400 includes three or more sub-oxide layers, the $O_3$ pre-treatment may be performed three or more times, too. That is, the performing of the pre-treatment using the $O_3$ gas and the forming of the sub-oxide layer may be repeatedly performed.

When comparing FIGS. 4B through 5 with FIGS. 4B, 6A through 6C, the method of forming the first oxide layer 400 may be selectively determined according to the thickness of the first oxide layer 400 to be formed. For example, if the thickness of the first oxide layer 400 to be formed is 350 Å or less, the first oxide layer 400 may be formed by performing the $O_3$ pre-treatment and the deposition process once as shown in FIGS. 4B and 5. Alternatively, if the thickness of the first oxide layer 400 to be formed is greater than 350 Å, the $O_3$ pre-treatment and the deposition processes are performed a plurality of times to form the first oxide layer 400, as shown in FIGS. 4B, 6A through 6C.

Figure 7A:
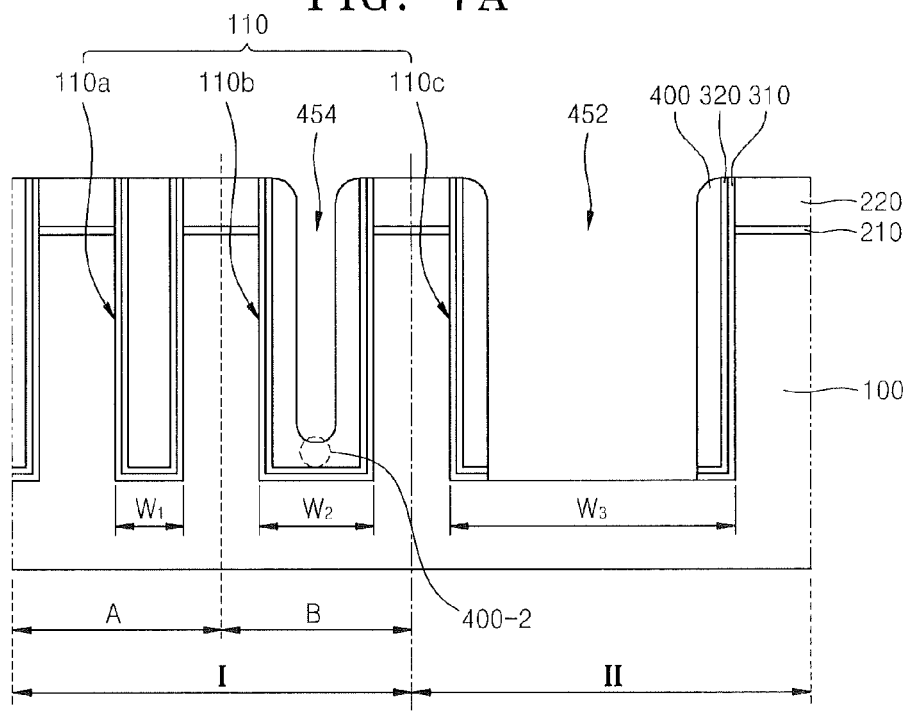
FIG. 7A is a cross-sectional view illustrating a process of partially removing the first oxide layer according to the embodiment of the present inventive concept.

FIG. 7A is a cross-sectional view illustrating a process of partially removing the first oxide layer 400 according to the embodiment of the present inventive concept. Referring to FIG. 7A, the first oxide layer 400 is partially removed by a dry-etching process or an anisotropic etching process such as an etch-back until the semiconductor substrate 100 under the bottom surface of the third trench 110c is exposed. Therefore, the first oxide layer 400 in the third trench 110c may be formed as a spacer. However, the inner space of the first trench 110a filled with the first oxide layer 400 remains. In the second trench 110b, the first oxide layer 400 covers the bottom surface of the second trench 110b. This is because the portion of first oxide layer 400-2 formed on the bottom surface of the second recess 454 is thicker than the portion of first oxide layer 400-1 formed on the bottom surface of the first recess 452, as described with reference to FIG. 5. Therefore, when the anisotropic etching process is stopped at a stage where the portion of first oxide layer 400-1 formed on the bottom surface of the first recess 452 is removed, a part of the portion of first oxide layer 400-2 formed on the bottom surface of the second recess 454 may remain. Thus, a depth of the second trench 110b having a smaller width than the third trench 110c may be reduced. Then, a gap-fill process for filling the inside of the second trench 110b, that is, a process of forming a second oxide layer that will be described later, may be performed easily with the structure of the second recess 454 that has the upper portion thereof wider than the lower portion thereof.

As shown in FIG. 5, since the thickness of the first oxide layer 400 formed on the mask layer patterns 220 and the thickness of the first oxide layer 400-1 formed on the bottom surface of the first recess 452 are nearly the same as each other, the first oxide layer 400 formed on the mask layer patterns 220 may be removed. In addition, the trench liner layer 320 or the buffer oxide layer 310 that is exposed due to the removal of the first oxide layer 400 may be removed together. That is, the trench liner layer 320 or the buffer oxide layer 310 that is formed on the bottom surface of the first recess 452 and the upper surfaces of the mask layer patterns 220 may be removed together.

Figure 7B:
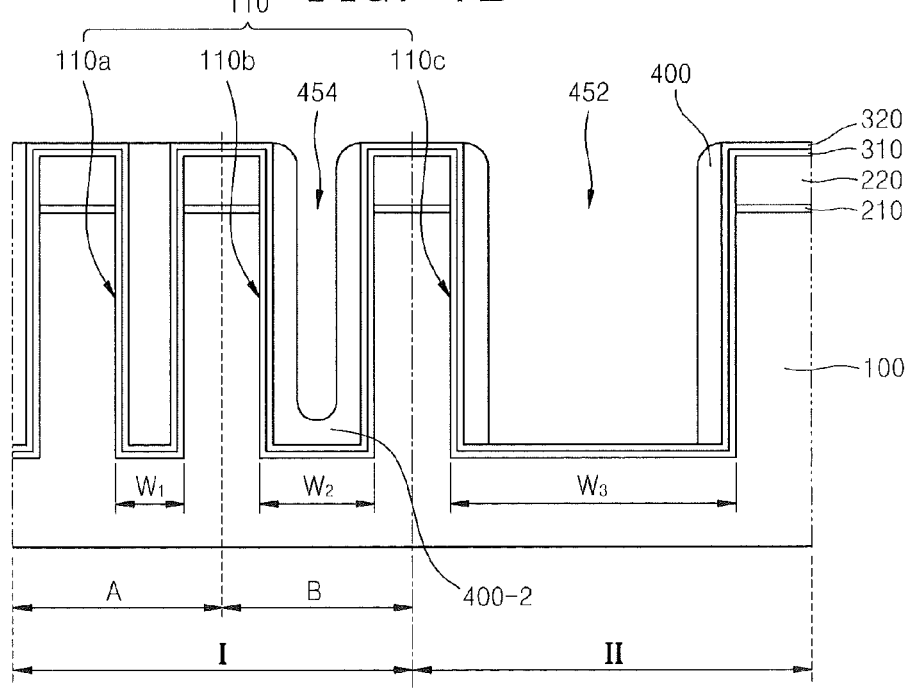
FIG. 7B is a cross-sectional view illustrating a process of partially removing the first oxide layer according to a modified example of the embodiment of the present inventive concept.

FIG. 7B is a cross-sectional view illustrating a process of partially removing the first oxide layer 400 according to a modified example of the present embodiment.

Referring to FIG. 7B, the buffer oxide layer 310 and the trench liner layer 320 formed on the bottom surface of the first recess 452 and the upper surfaces of the mask layer patterns 220 remain. Therefore, when comparing FIG. 7B with FIG. 7A, the difference is that the buffer oxide layer 310 and the trench liner layer 320 remain in FIG. 7B. This difference may be determined according to processing conditions of the anisotropic etching process for partially removing the first oxide layer 400 or processing margins. Therefore, there is no difference in that the first oxide layer 400 formed on the bottom surface of the first recess 452 and the upper surfaces of the mask layer patterns 220 is completely removed.

Figure 8:
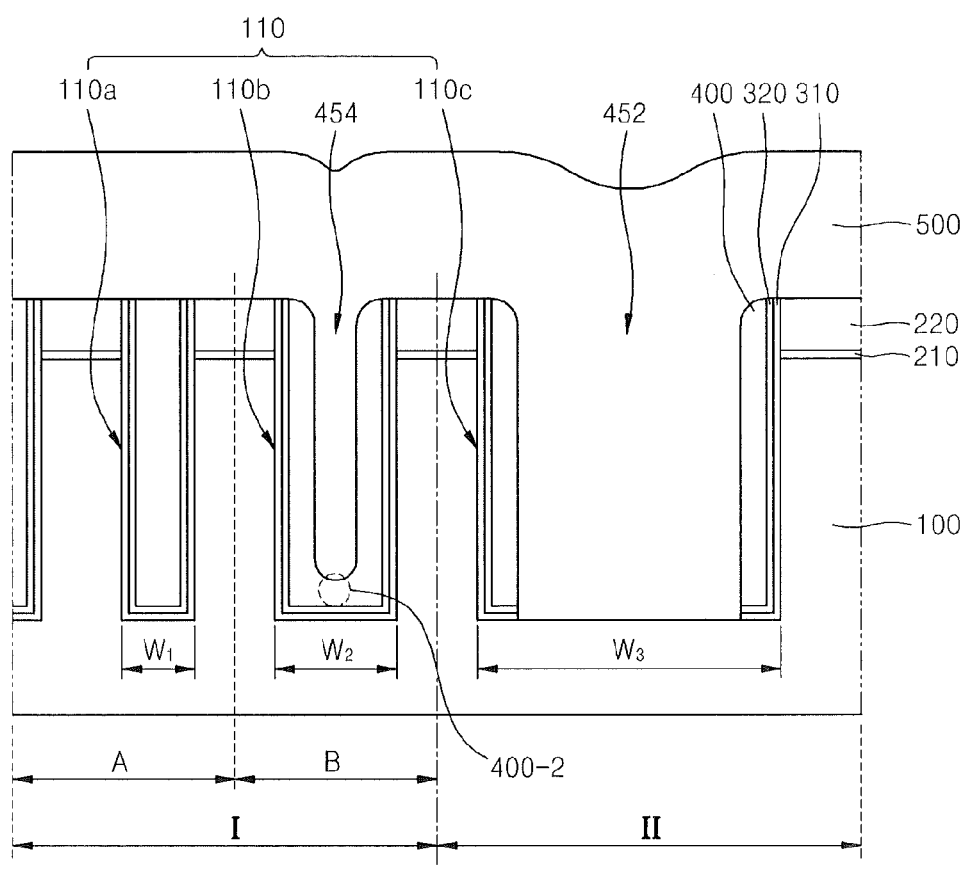
FIG. 8 is a cross-sectional view illustrating a process of forming a second oxide layer according to the embodiment of the present inventive concept.
Figure 9:
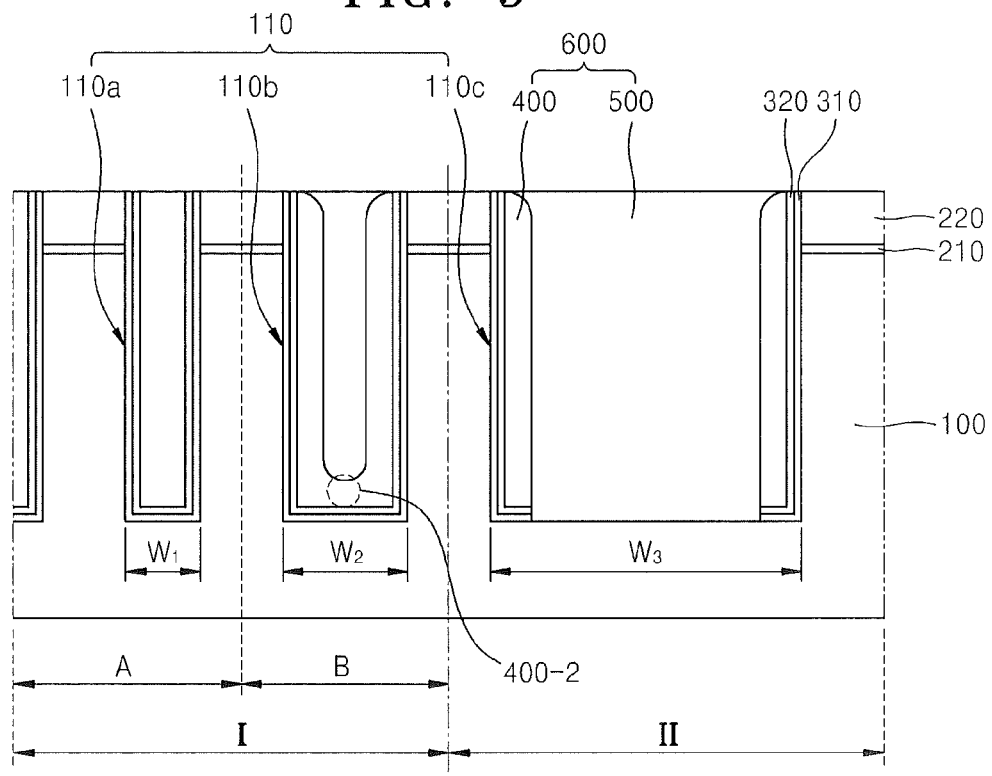
FIG. 9 is a cross-sectional view illustrating a process of partially removing the second oxide layer according to the embodiment of the present inventive concept.

FIG. 8 is a cross-sectional view illustrating a process of forming a second oxide layer 500 according to the embodiment of the present inventive concept. FIGS. 8 and 9 illustrate post-processes of the process shown in FIG. 7A. However, FIGS. 8 and 9 may be also applied to the embodiment shown in FIG. 7B. Referring to FIG. 8, after removing a part of the first oxide layer 400, the second oxide layer 500 is formed so as to cover the entire semiconductor substrate 100. The second oxide layer 500 forms the device isolation layer with the remaining first oxide layer 400. Therefore, the second oxide layer 500 may be formed of, for example, USG, in order to satisfy the electric insulating properties required to the device isolation layer.

The second oxide layer 500 may be formed to fill both of the first and second recesses 452 and 454. Therefore, the second trench 110b and the third trench 110c may be filled with the first oxide layer 400 and the second oxide layer 500. In order to fill out the first recess 452 having a greater width than that of the second recess 454, the second oxide layer 500 may be formed thick. Therefore, the second oxide layer 500 may be formed thick on the upper surfaces of the mask layer patterns 220.

The second oxide layer 500 may be formed at a second processing temperature that is relatively high. For example, the second oxide layer 500 may be formed by a deposition process at a processing temperature of 500° C. to 600° C. Here, the second processing temperature for forming the second oxide layer 500 is relatively higher than the first processing temperature for forming the first oxide layer 400.

When the second oxide layer 500 is formed at the second processing temperature that is relatively high, the deposition speed of the second oxide layer 500 is less affected by the material under the second oxide layer 500. That is, the first oxide layer 400 that is formed at the first processing temperature that is lower than the second processing temperature is affected by the material below the first oxide layer 400, as described above. Thus, when the first oxide layer 400 is formed thick at the first processing temperature, the first oxide layer 400 may be affected by previously formed parts of the first oxide layer 400, not by other layers under the first oxide layer 400. As described above, the first oxide layer 400 that is formed thick at the first processing temperature that is relatively low may be porous due to the affect of the previously formed parts of the first oxide layer. However, the second oxide layer 500 that is formed at the second processing temperature higher than the first processing temperature is relatively less affected by the material under the second oxide layer 500, and thus, may have uniform film quality.

After that, the semiconductor substrate 100 on which the first and second oxide layers 400 and 500 are formed is annealed so as to densify the first and second oxide layers 400 and 500. FIGS. 8 and 9 illustrate the first and second oxide layers 400 and 500 separately from each other. However, when the first and second oxide layers 400 and 500 are formed of the USG and formed under the same conditions except for the processing temperature, the first and second oxide layers 400 and 500 may be combined as a single layer due to the densification caused by the annealing.

FIG. 9 is a cross-sectional view illustrating a process of partially removing the second oxide layer 500 according to the embodiment of the present inventive concept. Referring to FIG. 9, the second oxide layer 500 is partially removed in order to expose the mask layer patterns 220. The second oxide layer 500 may be partially removed by a chemical mechanical polishing (CMP) process using the mask layer patterns 220 as an etch-stop layer or an etch-back process. Through the above process, a device isolation layer 600 may be formed of the first and second oxide layers 400 and 500.

As described above, the device isolation layer 600 includes the first oxide layer 400 that is formed at the relatively low processing temperature for preventing voids from generating in the first trench 110a having the narrowest width and the second oxide layer 500 that is formed at the relatively high processing temperature for preventing the pores from generating in the third trench 110c having the widest width. Thus, the device isolation layer 600 may have an insulating property for isolating devices with high reliability.

Figure 10:
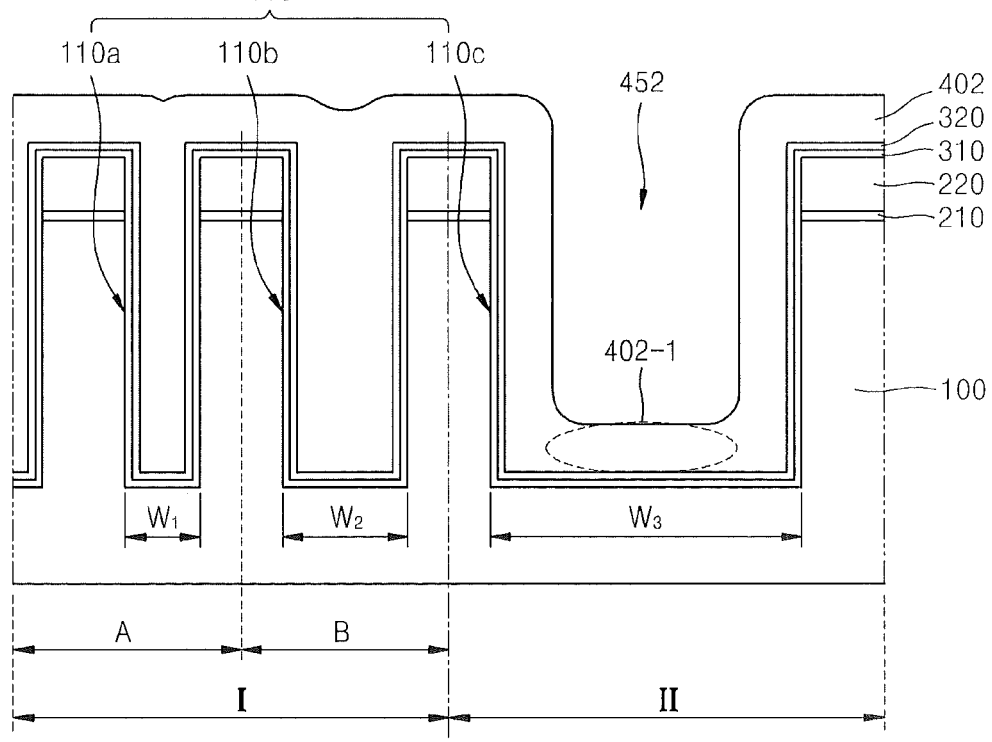
FIG. 10 is a cross-sectional view illustrating a process of forming a first oxide layer according to another embodiment of the present inventive concept.

FIGS. 10 through 13 are cross-sectional views illustrating a method of fabricating a semiconductor device according to another embodiment of the present inventive concept. FIG. 10 illustrates a post-process of the processes illustrated in FIGS. 1 through 4B, and the descriptions about the same elements as those of FIGS. 5 through 9 may not be provided.

FIG. 10 is a cross-sectional view illustrating a process of forming a first oxide layer 402 according to another embodiment of the present inventive concept. Referring to FIG. 10, the first oxide layer 402 is formed to cover the entire semiconductor substrate 100. The first oxide layer 402 becomes a part of a device isolation layer. Therefore, the first oxide layer 402 may be formed of, for example, the USG in order to satisfy the electric insulating properties required to the device isolation layer. The first oxide layer 402 may be formed to have a constant thickness from the surface of the semiconductor substrate 100. Therefore, the first trench 110a having the narrowest width is filled with the first oxide layer 402. After the first trench 110a is filled completely, and the first oxide layer 402 is further formed, the second trench 110b may be also filled with the first oxide layer 402. In this case, the third trench 110c having a greater width than those of the first and second trenches 110a and 110b may include the first recess 452.

The first oxide layer 402 may be formed at the first processing temperature that is relatively low by the deposition method. The first oxide layer 402 may be formed at the processing temperature of, for example, 300° C. to 460° C., through the deposition process. Here, the first processing temperature for forming the first oxide layer 402 is relatively lower than a processing temperature of the post-deposition process.

When comparing FIG. 5 with FIG. 10, the second trench 110b is not completely filled with the first oxide layer 400 and the second recess 454 is formed in FIG. 5, while the second trench 110b is completely filled with the first oxide layer 402 in FIG. 10. The embodiment of FIG. 10 may be applied only when the first oxide layer 402 filling the second width W2 of the second trench 110b does not grow abnormally as described with reference to FIG. 8. Although there may be various processing conditions and variations, it is easy to fill the second trench 110b completely with the first oxide layer 402 when the second width W2 of the second trench 110b is 300 Å or less. In addition, although not shown in the drawings, the first oxide layer 402 shown in FIG. 10 may include a plurality of sub-oxide layers, as described with reference to FIGS. 6A through 6C.

Figure 11A:
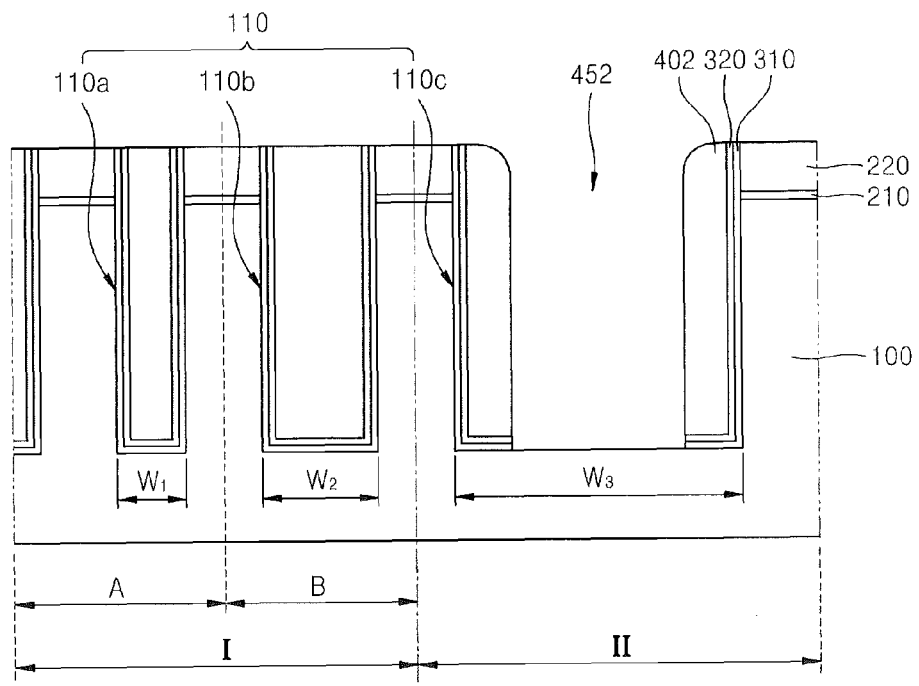
FIG. 11A is a cross-sectional view illustrating a process of partially removing the first oxide layer according to the embodiment of the present inventive concept.

FIG. 11A is a cross-sectional view illustrating a process of partially removing the first oxide layer 402 according to the embodiment of the present inventive concept. Referring to FIG. 11A, the first oxide layer 402 is partially removed by the anisotropic etching process such as dry-etching or etch-back until the semiconductor substrate 100 under the bottom surface of the third trench 110c is exposed. Therefore, in the third trench 110c, the first oxide layer 402 may be formed as a spacer. On the other hand, the first and second trenches 110a and 110b are still filled with the first oxide layer 402.

In addition, as shown in FIG. 10, the thickness of a portion of the first oxide layer 402 formed on the mask layer patterns 220 and the thickness of a portion of the first oxide layer 402-1 formed on the bottom surface of the first recess 452 are nearly the same as each other, and thus, the portion of the first oxide layer 402 formed on the mask layer patterns 220 may be removed. In addition, the trench liner layer 320 or the buffer oxide layer 310 that is exposed when the first oxide layer 402 is removed may be also removed. That is, the trench liner layer 320 or the buffer oxide layer 310 formed on the bottom surface of the first recess 452 and the upper surface of the mask layer patterns 220 may be removed together.

Figure 11B:
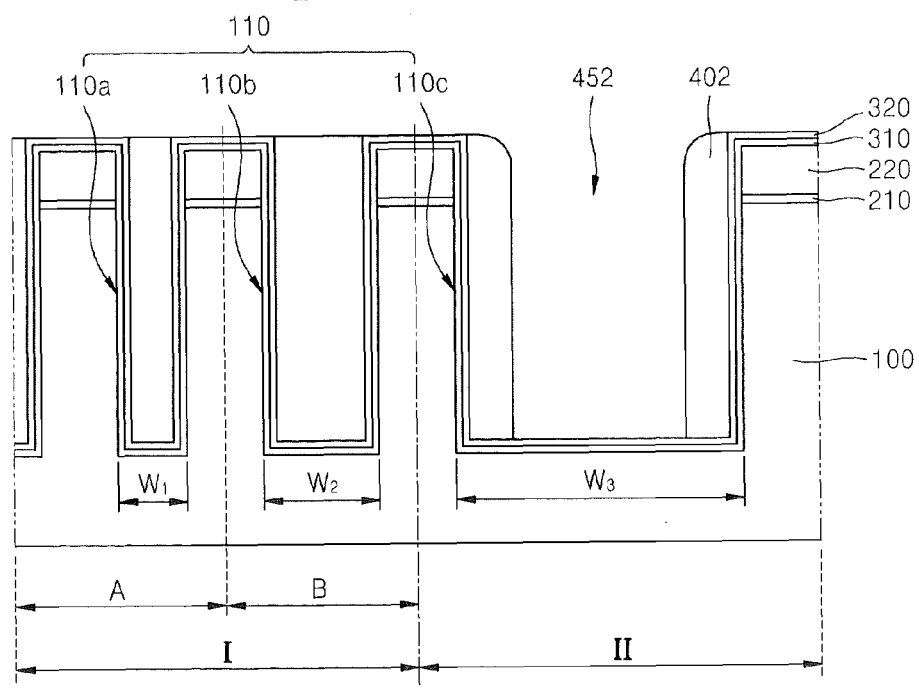
FIG. 11B is a cross-sectional view illustrating a process of partially removing a first oxide layer according to a modified example of the embodiment of the present inventive concept.

FIG. 11B is a cross-sectional view illustrating a process of partially removing the first oxide layer 402 according to a modified example of the present embodiment. Referring to FIG. 11B, the buffer oxide layer 310 and the trench liner layer 320 formed on the bottom surface of the first recess 452 and the upper surfaces of the mask layer patterns 220 remain. Therefore, FIG. 11B is different from FIG. 11A in that the buffer oxide layer 310 and the trench liner layer 320 remain. This difference may be determined according to the processing conditions or the processing margins of the anisotropic etching process for partially removing the first oxide layer 402. In addition, there is no difference in that the portion of the first oxide layer 402 formed on the bottom surface of the first recess 452 and the upper surfaces of the mask layer patterns 220 is completely removed.

Figure 12:
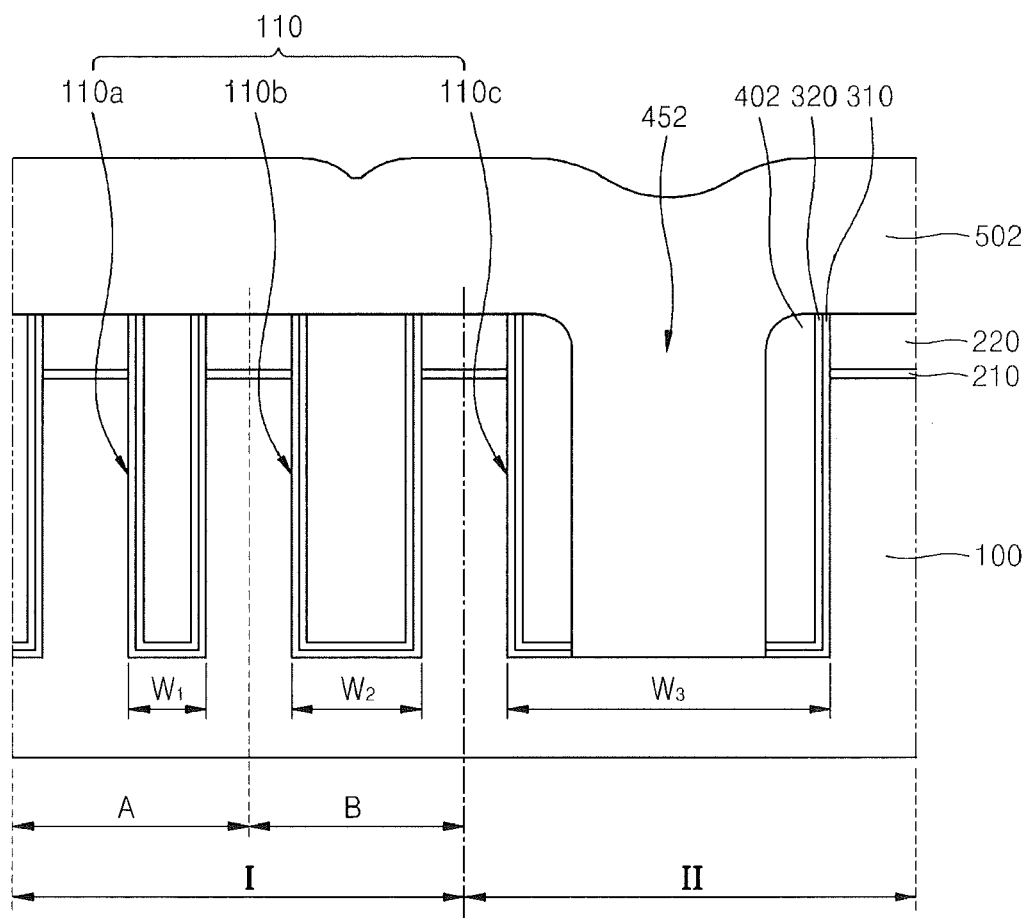
FIG. 12 is a cross-sectional view illustrating a process of forming a second oxide layer according to another embodiment of the present inventive concept.
Figure 13:
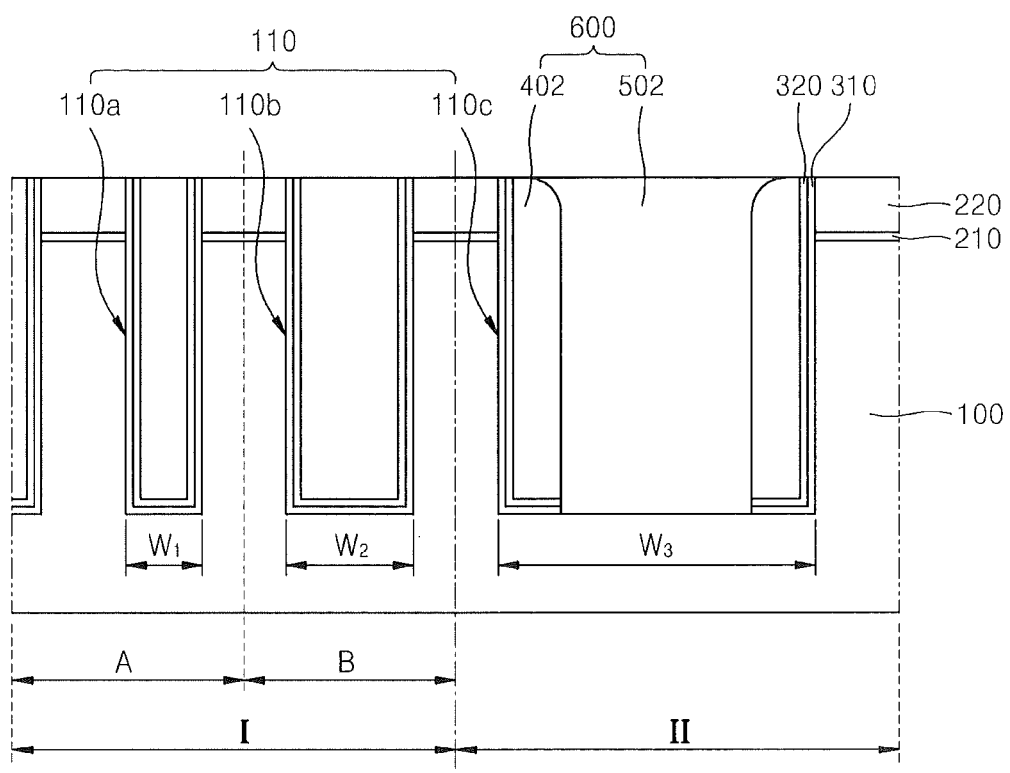
FIG. 13 is a cross-sectional view illustrating a process of partially removing the second oxide layer according to the embodiment of the present inventive concept.

FIG. 12 is a cross-sectional view illustrating a process of forming a second oxide layer according to the embodiment of the present invention. FIGS. 12 and 13 illustrate post-processes of the process shown in FIG. 11A. However, the post-processes of FIGS. 12 and 13 may be applied to the process of FIG. 11B. Referring to FIG. 12, after partially removing the first oxide layer 402, the second oxide layer 502 is formed to cover the entire semiconductor substrate 100. The second oxide layer 502 forms the device isolation layer with the remaining first oxide layer 402 after performing the post-processes. Therefore, the second oxide layer 502 may be formed of, for example, USG, in order to satisfy the electric insulating properties required to the device isolation layer.

The second oxide layer 502 may be formed to fill the first recess 452. Therefore, the third trench 110c is filled with the first oxide layer 402 and the second oxide layer 502. In order to fill the first recess 452, the second oxide layer 502 may be formed thick. Therefore, the second oxide layer 502 may be formed thick on the upper surfaces of the mask layer patterns 220.

The second oxide layer 502 may be formed at the second processing temperature that is relatively high through the deposition process. The second oxide layer 502 may be formed at the temperature of, for example, 500° C. to 600° C., through the deposition process. Here, the second processing temperature for forming the second oxide layer 502 is relatively higher than the first processing temperature for forming the first oxide layer 402. After that, the semiconductor substrate 100 on which the first and second oxide layers 402 and 502 are formed is annealed to densify the first and second oxide layers 402 and 502. Although FIGS. 12 and 13 illustrate the first and second oxide layers 402 and 502 separately from each other, the first and second oxide layers 402 and 502 may be combined as a single layer by the densification caused by the annealing when the first and second oxide layers 402 and 502 are formed of the USG and formed under the same processing conditions except for the processing temperature.

FIG. 13 is a cross-sectional view illustrating a process of partially removing the second oxide layer 502 according to the embodiment of the present inventive concept. Referring to FIG. 13, the mask layer patterns 220 may be exposed by partially removing the second oxide layer 502. The second oxide layer 502 may be removed by the CMP process using the mask layer patterns 220 as an etch-stop layer or the etch-back process. Through the above process, the device isolation layer 602 formed of the first and second oxide layers 402 and 502 may be formed.

While the inventive concept has been particularly shown and described with reference to exemplary embodiments thereof, it will be understood that various changes in form and details may be made therein without departing from the spirit and scope of the following claims.

What is claimed is:

1. A method of forming an integrated circuit substrate, comprising:
   forming first and second trenches having unequal widths in a semiconductor substrate:
   depositing a first oxide layer at a first temperature into the first and second trenches, said first oxide layer having a thickness sufficient to completely fill the first trench but only partially fill the second trench;
   selectively removing a portion of the first oxide layer from a bottom of the second trench; and
   depositing a second oxide layer at a second temperature greater than the first temperature onto the bottom of the second trench.

2. The method of claim 1, wherein said depositing a second oxide layer comprises filling the second trench with the second oxide layer.

3. The method of claim 2, wherein said selectively removing comprises exposing a portion of the bottom of the second trench; and wherein said depositing a second oxide layer comprises depositing the second oxide layer directly onto the exposed portion of the bottom of the second trench.

4. The method of claim 1, wherein said selectively removing comprises converting portions of the first oxide layer into electrically insulating spacers on sidewalls of the second trench; and wherein said depositing a second oxide layer comprises depositing the second oxide layer onto the electrically insulating spacers.

5. The method of claim 1, wherein the first and second oxide layers comprise undoped silica glass.

6. The method of claim 1, wherein the first temperature is in a range from 300° C. to 460° C. and the second temperature is in a range from 500° C. to 600° C.

7. The method of claim 1, wherein said depositing a first oxide layer comprises treating portions of the first oxide layer with ozone.

8. The method of claim 1, wherein said depositing a first oxide layer is preceded by lining sidewalls of the first and second trenches with a silicon nitride layer.

9. The method of claim 8, wherein said lining the sidewalls is preceded by depositing a buffer oxide layer directly onto the sidewalls of the first and second trenches.

10. The method of claim 1, wherein said depositing a first oxide layer is preceded by exposing the sidewalls and bottoms of the first and second trenches to ozone.

11. The method of claim 1, wherein said depositing a first oxide layer comprises depositing a plurality of sub-oxide layers in sequence into the first and second trenches and treating at least a first one of the plurality of sub-oxide layers with ozone.

12. A method of fabricating a semiconductor device, the method comprising:

preparing a semiconductor substrate, on which an active area is defined, by defining a first area and a second area, forming a first trench having a first width and a second trench having a second width greater than the first width in the first area, and forming a third trench having a third width greater than the second width in the second area;

forming a first oxide layer at a first temperature on the semiconductor substrate, on which the active area is defined, so as to fill the first trench and to form a first recess in the third trench;

removing the first oxide layer partially so that the first oxide layer formed on a bottom surface of the first recess is removed; and forming a second oxide layer at a second temperature that is higher than the first temperature so as to fill the third trench.

13. The method of claim 12, wherein the first and second oxide layers comprise updoped silica glass (USG).

14. The method of claim 12, wherein the first temperature ranges from 300° C. to 460° C.

15. The method of claim 12, wherein the second temperature ranges from 500° C. to 600° C.

16. The method of claim 12, wherein the preparing of the semiconductor substrate comprises:

forming mask layer patterns covering the active area on a preliminary semiconductor substrate; and forming the first trench, the second trench, and the third trench by etching the preliminary semiconductor substrate by using the mask layer patterns as an etching mask.

17. The method of claim 16, wherein in the forming of the first oxide layer, a deposition speed of the first oxide layer on the semiconductor substrate is faster than the deposition speed of the first oxide layer on the mask layer patterns.

18. The method of claim 17, wherein the mask layer patterns comprise a silicon nitride layer.

19. The method of claim 16, further comprising forming a buffer oxide layer or a trench liner layer covering inner surfaces of the first trench, the second trench, and the third trench, after preparing the semiconductor substrate.

20. The method of claim 12, wherein the forming of the first oxide layer is performed so that a second recess is formed in the second trench.

* * * * *